United States Patent
van der Wagt

[11] Patent Number: 5,953,249
[45] Date of Patent: Sep. 14, 1999

[54] MEMORY CELL HAVING NEGATIVE DIFFERENTIAL RESISTANCE DEVICES

[75] Inventor: Jan P. van der Wagt, Dallas, Tex.

[73] Assignee: Texas Instruments Incorporated, Dallas, Tex.

[21] Appl. No.: 09/210,077

[22] Filed: Dec. 11, 1998

Related U.S. Application Data

[62] Division of application No. 08/883,737, Jun. 27, 1997, Pat. No. 5,883,829.

[51] Int. Cl.$^6$ .................................................. H01L 29/205
[52] U.S. Cl. ............................ 365/175; 365/72; 365/156; 257/25; 257/24
[58] Field of Search ............................ 365/175, 72, 156; 257/25, 24, 22

[56] References Cited

U.S. PATENT DOCUMENTS

| | | | |
|---|---|---|---|
| 4,902,912 | 2/1990 | Capasso et al. | 307/322 |
| 5,093,699 | 3/1992 | Weichold et al. | 357/22 |
| 5,229,623 | 7/1993 | Tanoue et al. | 257/25 |
| 5,313,117 | 5/1994 | Maezawa | 307/450 |
| 5,336,949 | 8/1994 | Mimura | 307/448 |
| 5,389,804 | 2/1995 | Yokoyama et al. | 257/197 |
| 5,432,356 | 7/1995 | Imamura | 257/24 |
| 5,543,652 | 8/1996 | Ikeda et al. | 257/377 |
| 5,646,884 | 7/1997 | Van der Wagt et al. | 365/175 |

Primary Examiner—Viet Q. Nguyen
Attorney, Agent, or Firm—Christopher L. Maginniss; W. James Brady III; Richard L. Donaldson

[57] ABSTRACT

A memory system is organized as a matrix including a memory cell at each intersection of a bit line with write and read word lines. Each memory cell comprises a first FET 20 having its gate coupled to a write word line and its drain coupled to a bit line, a second FET 22 having its source coupled to the bit line and its drain coupled to a read word line, and first and second negative resistnce devices 24,26 coupled in series between a supply voltage and a substrate voltage, the common point SN of the series-connected negative resistance devices being coupled to the source of the first FET and to the gate of the second FET. Preferably, the first FET 20 is a p-channel device, the second FET 22 is an n-channel device, and the first and second negative resistance devices 24,26 are RTDs. In a second embodiment, a memory system has a memory cell at each intersection of a bit line with a word line. The memory cell comprises an FET having its gate coupled to a word line and one of its drain and source electrodes coupled to a bit line, first and second negative resistance devices 44,46 coupled in series between a supply voltage and a substrate voltage, the common point SN of the series-connected negative resistance devices being coupled to the other of the drain and source electrodes, and a capacitance 48 coupled between the common point of the series-connected negative resistance devices.

3 Claims, 3 Drawing Sheets

MEMORY CELL HAVING NEGATIVE DIFFERENTIAL RESISTANCE DEVICES

This is a divisional application of Ser. No. 08/883,737 filed Jun. 27, 1997, now U.S. Pat. No. 5,883,829.

The U.S. Government has rights in this invention pursuant to Contract No. 94C-4106, awarded by the U.S. Government.

TECHNICAL FIELD OF THE INVENTION

The present invention relates generally to electronic circuits and, more particularly, to memory cells having negative differential resistance devices such as resonant tunneling diodes.

BACKGROUND OF THE INVENTION

High density integrated semiconductor random access memory (RAM) is reaching the gigabit scale, led by the progressive evolutionary development of dynamic RAM (DRAM). The 1T/1C DRAM cell, consisting of a pass transistor and a capacitor, has the smallest possible cell size, ranging between $4F^2$ and $8F^2$, where F is the minimum feature size. However, DRAM requires periodic refreshing, on the order of once per millisecond, since a bit is stored as charge on a capacitor, and the charge leaks away, at a rate of approximately 1 fA ($10^{-15}$ A) per cell.

Static RAM (SRAM) provides enhanced functional qualities; no refreshing is needed and it is also generally faster than DRAM (approximately 25 nsec for SRAM compared to approximately 80 nsec for DRAM). However, the SRAM cell is more complex, requiring either six transistors or four trnsistors and two polysilicon load resistors, resulting in a cell size approximating 60 $F^2$. It would be highly desirable to have memory cells with the functional qualities of SRAM, but with cell density closer to that of DRAM.

A resonant tunneling diode (RTD) in its simplest form consists of a sequence of five semiconductor layers. The outer two layers are the contact layers into which electrons enter and exit the semiconductor layer sequence. The interior three dissimilar semiconductor layers differ in their energy band gaps in the sequence wide/narrow/wide band gap with layer thicknesses comparable to the electron Bloch wavelength (typically less than 10 nm). This sequence of layers produces an energy profile through which electrons must travel and which consists of two energy barriers separated by a narrow region referred to as a quantum well.

Classically, an electron with energy, called the Fermi energy, approaching the first energy barrier with an energy below the barrier energy is reflected, analogous to a baseball rebounding off a concrete wall or to an electromagnetic wave at the end of an open-circuited transmission line. Quantum mechanics, however, allows that as the physical dimensions of the barrier decrease toward the wavelength of the particle, there is an increasing probability that the particle will be transmitted instead of reflected. Thus under certain conditions an electron can pass through the barrier even with energy below the barrier potential. This classically-forbidden phenomenon is called tunneling.

If the quantum well width is selected to be approximately equal to some integer or half-integer multiple of the electron wavelength, a standing wave can be built up by constructive interference analogous to the standing waves in a microwave cavity. Electrons at these wavelengths couple into and out of the quantum well more readily than others.

The electron energy, E, and its wavelength, 1, are inversely related by the equation, $E=h^2/2\,ml^2$, where h is Planck's constant and m is the effective electron mass. Since the electron's energy can be controlled by adjusting the bias across the structure, the transmission (or current flow) through the double-barrier depends sensitively on the applied voltage. One can think of the double-barrier structure as an energy bandpass filter which transmits for certain applied biases and reflects the electron for other applied biases. The electron is said to be in resonance when the incoming electron energy matches the resonant transmission energy of the quantum-well structure.

In the RTD, the current increases monotonically with applied voltage until the average incoming electron energy is approximately equal to the resonance energy and the electron tunnels efficiently through the double-barrier structure. At slightly higher energy (applied bias) the electron no longer couples into the well efficiently and the transmission (current) is reduced. At still higher applied voltages, the electron's energy is sufficient for it to get over the barriers giving rise to an increasing current with bias. Thus the current-voltage characteristic of the resonant tunneling diode is N-shaped. It is this characteristic which is utilized to advantage in resonant tunneling electron devices.

RTDs are often used in logic and analog signal processing circuits. They display a multistate and/or multilevel switching characteristic that is very useful in reducing the size, power dissipation or delay of conventional circuits. However, the operation of an RTD often creates a problem due to its inherent electrical hysteresis. Once switched from a low to a high voltage or current state, a reset of its applied bias is required to return the device to its original state.

The traditional Goto cell, which is disclosed in E. Goto, IRE Trans. Electronic Computers, March 1960, at p. 25, consists of a pass transistor 10 and two RTDs 12 and 14, and is shown in FIG. 1a, has the advantage of compactness and being static. FIG. 1b illustrates a load line analysis of the circuit of FIG. 1a, showing the two stable latching points 16 and 18. However, for RTDs with sufficient current drive, the valley current causes large static power dissipation. Thus, the idea of a "gain stage" to amplify the action of the RTD latch pair arises.

For CMOS gigabit DRAM, a number of 2-transistor (2T) gain cells have been proposed, four of which are shown in FIGS. 2a through 2d, to reduce the required storage node capacitance. The circuit of FIG. 2a is disclosed in H. Shichijo et al., Ext. Abs. 16th Int. Conf. on Solid State Dev. and Mat. (1984), p. 265. The circuit of FIG. 2b is disclosed in W. Kim, IEEE J. Solid State Circuits, vol. 29 (1994) at p. 978. The circuit of FIG. 2c is disclosed in S. Shukuri, Int. Electron Dev. Meeting Tech. Digest (1992) at p. 32.8.1. The circuit of FIG. 2d is disclosed in M. Terauchi, 1993 Symp. VLSI Tech. Digest, at p. 21. Advantages of these cells include high noise margin, ultra-low static power, and high current drive capacity. Disadvantages of these circuits are that the refresh requirement remains necessary, and multistate operation is not possible.

SUMMARY OF THE INVENTION

In view of the above mentioned difficulties, it is a primary objective of the present invention to provide memory cells with the functional qualities of SRAM, but with cell density closer to that of DRAM.

The present invention includes a memory cell comprising a p-channel FET having its gate electrode coupled to a write word line and its drain electrode coupled to a bit line, and an n-channel FET having its source electrode coupled to the bit line and its drain electrode coupled to a read word line. A pair of series connected resonant tunneling diodes coupled between a supply voltage and substrate voltage have their common connection coupled to the source electrode of the p-channel FET and to the gate electrode of the n-channel FET.

BRIEF DESCRIPTION OF THE DRAWINGS

The foregoing features of the present invention may be more fully understood from the following detailed description, read in conjunction with the accompanying drawings, wherein:

FIG. 1b load line analysis of the circuit of FIG. 1a;

DESCRIPTION OF THE PREFERRED EMBODIMENT

Figure 3:
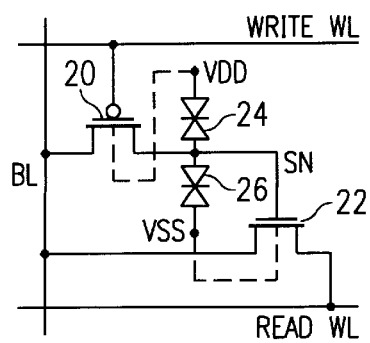
FIG. 3 illustrates a memory cell circuit in accordance with one embodiment of the present invention.

Referring initially to FIG. 3, there is shown a circuit, functioning as a memory cell, in which the stated advantages, but none of the stated disadvantages, of the previously mentioned prior art memory cell designs are combined. This memory cell circuit includes p-channel FET 20, n-channel FET 22, and resonant tunneling diodes (RTDs) 24 and 26. The circuit is configured such that p-channel FET 20 has its gate electrode coupled to a write word line and its drain electrode coupled to a bit line. N-channel FET 22 has its source electrode coupled to the bit line and its drain electrode coupled to a read word line. RTDs 24 and 26 are coupled as a series-connected pair between a supply voltage $V_{DD}$ and substrate voltage $V_{SS}$ and have their common connection coupled to the source electrode of p-channel FET 20 and to the gate electrode of n-channel FET 22 at storage node SN.

Figure 1A:
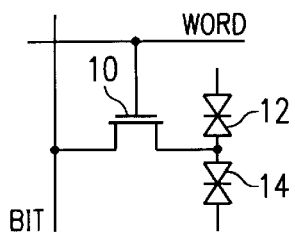
FIG. 1a illustrates a prior art memory cell including a pair of resonant tunneling diodes.
Figure 2A:
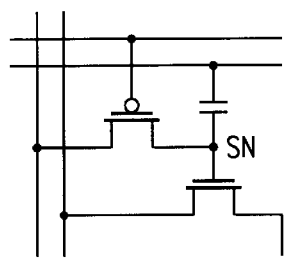
FIGS. 2a through 2d illustrate four 2-transistor gain cells of the prior art which purport to reduce storage node capacitance.
Figure 1B:
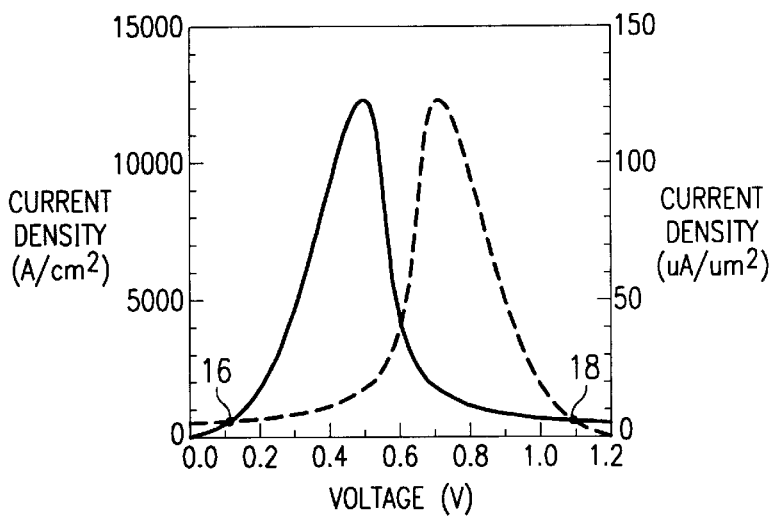
Figure 2B:
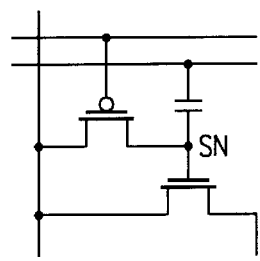
Figure 2C:
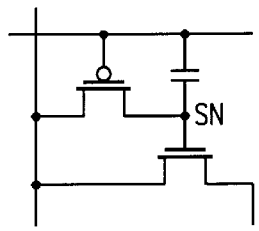
Figure 2D:
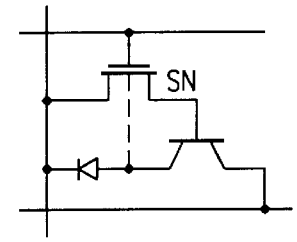

A CMOS cell similar to that taught in the Shukuri et al. reference, and shown in FIG. 2c, is assumed, thereby allowing operation at 1 volt. The latching operation of the pair of RTDs 24 and 26 cancels any leakage currents which might normally disturb the cell state, thereby eliminating the refresh requirement. Thus, the DRAM cell of the type shown in FIG. 1 is trnsformed into a SRAM cell by the modification of the FIG. 3 device.

The strength of this configuration of RTDs 24 and 26 is that they can be ultra-low current density devices, as their active current needs to be only slightly larger than the leakage current of a DRAM cell of the type shown in FIG. 1. These currents are on the order of 1 fA ($10^{-15}$ A) per cell, leading to an ultra-low required RTD current density of only $10^{-6}$ A/cm². At such current levels, the RTD latch 24, 26 has a time constant in the millisecond range. Any higher current level will increase latching speed, which is not necessary, but dissipate extra power. No high peak-to-valley current ratio of RTDs 24 and 26 is required, as long as non-destructive readout (NDR) is present.

Figure 4:
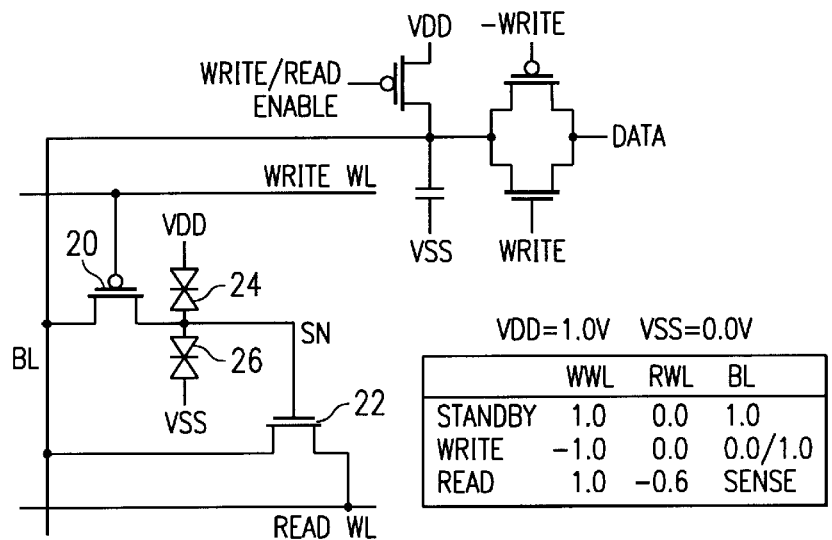
FIG. 4 illustrates a circuit used to simulate the memory cell of FIG. 3.

The memory cell of FIG. 3 was simulated using SPICE, a standard computer modelling program for integrated circuit emulation. The simulation used standard 0.4 μm gate length silicon CMOS transistor models and Texas Instruments-developed SPICE RTD models. The simulation circuit is shown in FIG. 4. The widths of the p-channel write FET 20 and the a-channel read-FET 22 we chosen to be equal to 1 μm, and the areas of the two RTDs 24 and 26 were chosen to be equal to 0.25 μm². The table at FIG. 4 defines the three states of the memory cell. "Standby" means that the cell will not be written to or read from even when cells on the same word line or bit line are being addressed.

Figure 5:
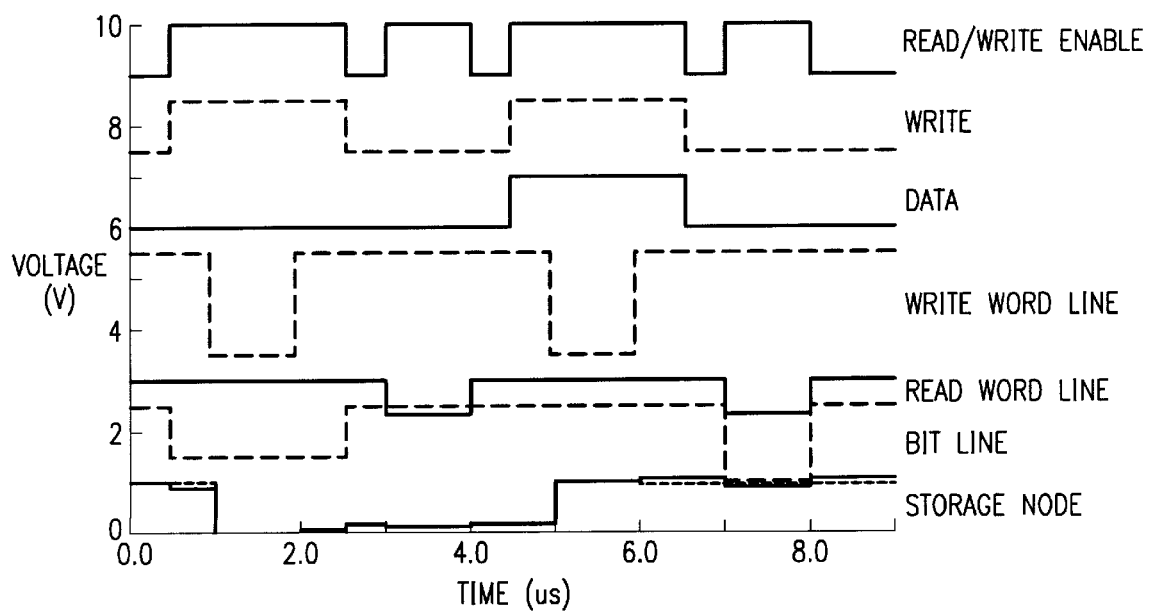
FIG. 5 illustrates the waveforms of the simulation of FIG. 4.

FIG. 5 shows the result of the above simulation for parameters of RTDs 24 and 26 chosen to yield $10^{-4}$ A/cm² valley current density (0.25 pA/cell), shown in FIG. 5 as solid lines, and a peak-to-valley current ratio of about 8. On the time scale shown, explicit latching of the RTDs cannot be observed, and the cell operates essentially as it would without the presence of RTDs 24 and 26. When the current density is increased by a factor of 1000, shown in FIG. 5 as dashed lines, some latching effects begin to be seen, even on the μsec scale. This implicitly shows that an ultra-low current density pair of RTDs will make the DRAM cell of FIG. 1 stable against leakage.

Figure 6A:
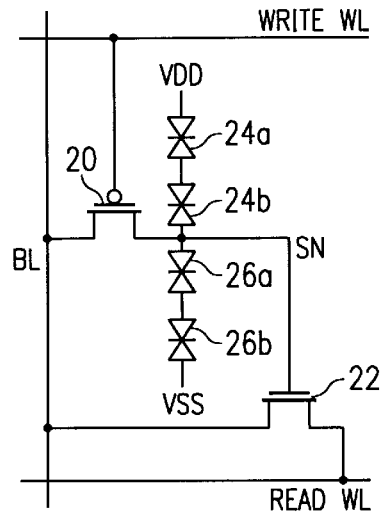
FIG. 6a illustrates a memory cell circuit in accordance with a second embodiment of the present invention.
Figure 6B:
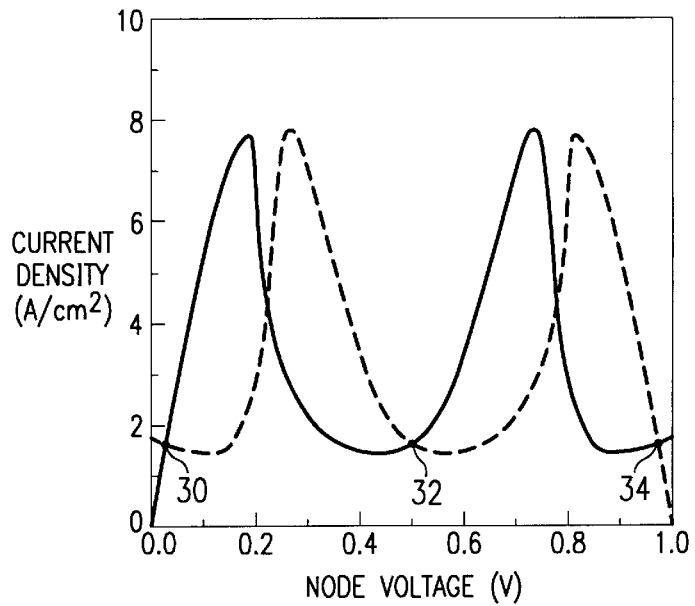
FIG. 6b illustrates a load line graph showing three stable points for the middle node of four series-connected RTDs in the FIG. 6a embodiment.

An added benefit to the memory cell of the present invention is multi-state operation. FIG. 6a illustrates a memory cell circuit in accordance with a second embodiment of the present invention, wherein three stable states are obtained by increasing the number of RTIs on each side of storage node SN from one to two, yielding a series connection of RTDs 24a, 24b, 26a and 26b. FIG. 6b illustrates a load line graph showing three stable points 30, 32 and 34 for the middle node SN of four series-connected RTDs in the FIG. 6a embodiment.

Figure 7:
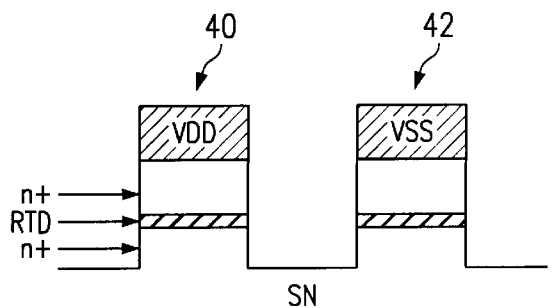
FIG. 7 illustrates a view of an RTD latch structure.

FIG. 7 illustrates a view of an RTD latch structure. In this structure the two "legs" of the RTD stack are two mesa-shaped columns 40 and 42, and they share the same epitaxial layer structure containing one, two or more RTDs. This type of structure is present on storage node SN, i.e. the source electrode of write FET 20 of FIG. 3.

RTDs have been realized in an InP-based material system with current densities on the order of only 1 A/cm² (and peak-to-valley ratio around 8). This is four to five orders of magnitude lower than for conventional high-speed RTDs, but still much higher than the number $10^{-6}$ A/cm² which was discussed earlier as a goal.

The CMOS devices and RTDs described for use in the present invention may be integrated in a III/V semiconductor system. Direct integration seems possible only with lift-off and epitaxial placement techniques, which are currently in development at some places, but may never reach a cost level that is compatible with CMOS DRAM mass production. Another option is the possible development of ultra-low current RTDs based on silicon. Yet another option would employ ultra-low current density Esaki Type diodes based on Si or SiGe.

Another cell, closely related to the cell discussed in relation to FIG. 3, is described in the text which follows. It does not have a gain stage (equivalent to read transistor 22 of FIG. 3), but instead keeps the large (~25 fF) DRAM capacitor 48 along with a negative differential resistance (NDR) diode latch 44 and 46.

Figure 8A:
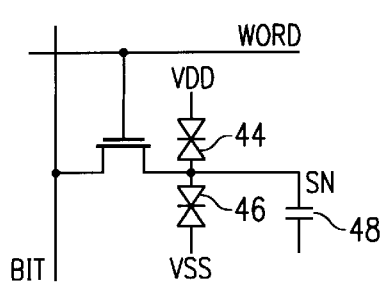
FIG. 8a illustrates a memory cell circuit in accordance with a third embodiment of the present invention.

FIG. 8a illustrates a cell which demonstrates some amount of similarity both to a Goto cell (FIG. 1a) and to a standard DRAM cell (one pass transistor and a capacitor, i.e. 1T/1C). Its operation is closest to that of the DRAM cell: The RTD pair comprising diodes 44 and 46 merely compensates for the leakage current of capacitor 48. Again, the DRAM cell is transformed into an SRAM cell. The RTD latch 44 and 46 is again ultra-low current density (as opposed to the Goto cell of FIG. 1b), since capacitor 48 (~25 fF) drives the bit line during the read operation, as in conventional DRAM.

The cell of FIG. 8a is less robust than the 2T/NDR diode cell, but has the potential of very small size (close to DRAM cell size). It will also have a lower speed, namely the same as the corresponding DRAM cell speed. Finally, the read operation will have to be performed just as in DRAM, with automatic refresh. The important difference with DRAM is that no other (periodic) refresh operation is required. A negative difference with the conventional DRAM cell is that one more bias line (VDD or VSS) must be supplied to each cell. Multi-valued data storage, while not impossible, will be much harder with this design that the 2T/NDR diode cell of FIG. 3.

Figure 8B:
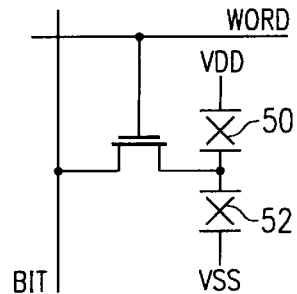
FIG. 8b illustrates a memory cell circuit in accordance with a fourth embodiment of the present invention.

Materials issues with the FIG. 8a embodiment are generally the same as for the 2T/NDR diode cell of FIG. 3, with the exception that one should realize the large capacitance 48 as a physical part of NDR diodes. Such a device is shown in FIG. 8b, wherein negative differential resistance diodes 50 and 52 physically incorporate the needed capacitance. The following are considered important properties for the cell of FIG. 8a:

1. Current level of approximately $10^{-6}$ A/cm$^2$ (or even lower);
2. I-V characteristic displays negative differential resistance, with the second minimum in the one-volt or lower range; and
3. capacitance of ~15 fF (the two negative differential resistance diodes 44 and 46 connect in parallel to SN).

The device of FIG. 8a may be considered either a "high capacitance NDR diode" or an "NDR leakage current capacitor." Current DRAM capacitors satisfy the above properties 1 and 3 (with 75 fF/$\mu$m$^2$ for Gbit cell designs), but not property 2. Realization of this "anomalous" capacitor means that existing DRAM designs could be turned into SRAM designs with only a slight hit in density and with the addition of one more bias line per cell. This would be much better than current SRAM cell architectures, except possibly for access speed.

While the principles of the present invention have been demonstrated with particular regard to the structures disclosed herein, it will be recognized that various departures may be undertaken in the practice of the invention. The scope of the invention is not intended to be limited to the particular structures disclosed herein, but should instead be gauged by the breadth of the claims which follow.

What is claimed is:

1. In a memory system organized as a matrix including a memory cell at each intersection of a bit line with a word line, said memory cell comprising:

a field effect transistor (FET) having its gate electrode coupled to a word line and one of its drain and source electrodes coupled to a bit line;

first and second negative resistance devices coupled in series between a supply voltage and a substrate voltage, the common point of said series-connected negative resistance devices being coupled to the other of said drain and source electrodes; and a capacitance coupled between said common point of said series-connected negative resistance devices and one of said supply and substrate voltages.

2. The memory cell in accordance with claim 1 wherein said FET is an n-channel FET.

3. The memory cell in accordance with claim 1 wherein said first and second negative resistance devices are resonant tunneling diodes (RTDs).

* * * * *